United States Patent
Daibou et al.

(10) Patent No.: US 12,075,629 B2
(45) Date of Patent: Aug. 27, 2024

(54) MAGNETIC MEMORY DEVICE WITH NONMAGNETIC LAYER HAVING TWO ADDITIVE ELEMENTS

(71) Applicant: Kioxia Corporation, Tokyo (JP)

(72) Inventors: Tadaomi Daibou, Yokkaichi Mie (JP); Yasushi Nakasaki, Yokohama Kanagawa (JP); Tadashi Kai, Yokohama Kanagawa (JP); Hiroki Kawai, Inazawa Aichi (JP); Takamitsu Ishihara, Yokohama Kanagawa (JP); Junichi Ito, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 422 days.

(21) Appl. No.: 17/482,865

(22) Filed: Sep. 23, 2021

(65) Prior Publication Data
US 2022/0013579 A1    Jan. 13, 2022

Related U.S. Application Data

(63) Continuation-in-part of application No. 16/570,020, filed on Sep. 13, 2019, now Pat. No. 11,355,694.

(30) Foreign Application Priority Data

Mar. 20, 2019   (JP) .................. 2019-052166

(51) Int. Cl.
*H10B 61/00* (2023.01)
*H10N 50/10* (2023.01)
*H10N 50/80* (2023.01)

(52) U.S. Cl.
CPC ............. *H10B 61/00* (2023.02); *H10N 50/10* (2023.02); *H10N 50/80* (2023.02)

(58) Field of Classification Search
CPC .................................. H10B 61/00; H10N 50/10
See application file for complete search history.

(56) References Cited

U.S. PATENT DOCUMENTS 9,123,879 B2   9/2015   Nakayama et al.
9,178,134 B2   11/2015  Nakayama et al.
(Continued)

FOREIGN PATENT DOCUMENTS

CN    102792478 A    11/2012
JP    4185056 B2     1/2005
(Continued)

OTHER PUBLICATIONS

Final Office Action dated Dec. 22, 2021, issued in related U.S. Appl. No. 16/570,020.
(Continued)

*Primary Examiner* — Jay C Chang
*Assistant Examiner* — Mikka Liu
(74) *Attorney, Agent, or Firm* — Holtz, Holtz & Volek PC

(57) ABSTRACT

According to one embodiment, a magnetic memory device including a stacked structure including a first magnetic layer having a variable magnetization direction, a second magnetic layer having a fixed magnetization direction, and a nonmagnetic layer provided between the first magnetic layer and the second magnetic layer, and containing magnesium (Mg) and oxygen (O). The nonmagnetic layer further contains a first additive element and a second additive element, the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg), and the second additive element is lithium (Li).

16 Claims, 1 Drawing Sheet

(56) References Cited

U.S. PATENT DOCUMENTS

| | | | |
|---|---|---|---|
| 9,178,137 B2 | 11/2015 | Eeh et al. | |
| 9,184,374 B2 | 11/2015 | Sawada et al. | |
| 9,231,196 B2 | 1/2016 | Sugiura et al. | |
| 9,236,563 B2 | 1/2016 | Hashimoto et al. | |
| 9,269,890 B2 | 2/2016 | Nakayama et al. | |
| 9,368,717 B2 | 6/2016 | Toko et al. | |
| 9,385,304 B2 | 7/2016 | Nakayama et al. | |
| 9,397,287 B1* | 7/2016 | Annunziata | H10N 50/01 |
| 9,406,871 B2 | 8/2016 | Nakayama et al. | |
| 9,590,174 B2 | 3/2017 | Toko et al. | |
| 9,647,034 B2 | 5/2017 | Nakayama et al. | |
| 10,026,891 B2 | 7/2018 | Nagase et al. | |
| 10,522,746 B1 | 12/2019 | Sundar et al. | |
| 10,573,805 B2 | 2/2020 | Murayama et al. | |
| 10,707,269 B2 | 7/2020 | Nagase et al. | |
| 10,707,356 B2 | 7/2020 | Yakabe et al. | |
| 11,094,743 B2 | 8/2021 | Iwayama et al. | |
| 11,133,456 B2 | 9/2021 | Iwasaki et al. | |
| 2006/0163676 A1 | 7/2006 | Shimizu et al. | |
| 2009/0067232 A1* | 3/2009 | Korenivski | B82Y 25/00 365/171 |
| 2011/0031569 A1 | 2/2011 | Watts et al. | |
| 2011/0032644 A1 | 2/2011 | Watts et al. | |
| 2012/0155156 A1 | 6/2012 | Watts et al. | |
| 2012/0205762 A1* | 8/2012 | Matsukawa | H10N 50/10 257/E29.323 |
| 2012/0231945 A1 | 9/2012 | Watanabe et al. | |
| 2013/0069182 A1 | 3/2013 | Ohsawa et al. | |
| 2013/0142324 A1 | 6/2013 | Nagai et al. | |
| 2013/0145162 A1 | 6/2013 | Nagai et al. | |
| 2013/0249026 A1 | 9/2013 | Kitagawa et al. | |
| 2014/0008742 A1 | 1/2014 | Chen et al. | |
| 2014/0264673 A1* | 9/2014 | Kitagawa | H10N 50/10 257/421 |
| 2014/0284534 A1 | 9/2014 | Nagase et al. | |
| 2015/0069548 A1 | 3/2015 | Nakayama et al. | |
| 2015/0069554 A1 | 3/2015 | Nakayama et al. | |
| 2015/0225297 A1 | 8/2015 | Sato et al. | |
| 2016/0155932 A1 | 6/2016 | Chen et al. | |
| 2017/0155042 A1 | 6/2017 | Yuasa | |
| 2017/0186943 A1 | 6/2017 | Annunziata et al. | |
| 2017/0236999 A1 | 8/2017 | Kim | |
| 2017/0358737 A1 | 12/2017 | Chen et al. | |
| 2018/0083185 A1 | 3/2018 | Kai et al. | |
| 2018/0261269 A1 | 9/2018 | Roiz Wilson | |
| 2018/0346851 A1 | 12/2018 | Moon et al. | |
| 2019/0064661 A1 | 2/2019 | Yang et al. | |
| 2019/0280186 A1 | 9/2019 | Kashiwada et al. | |
| 2020/0403150 A1 | 12/2020 | Nomoto et al. | |
| 2021/0082999 A1 | 3/2021 | Toko et al. | |

FOREIGN PATENT DOCUMENTS

| | | |
|---|---|---|
| JP | 2013069788 A | 4/2013 |
| JP | 2013118607 A | 6/2013 |
| JP | 2013197345 A | 9/2013 |
| JP | 2013254957 A | 12/2013 |
| JP | 5873366 B2 | 1/2016 |
| JP | 6067306 B2 | 1/2017 |
| JP | 2018501647 A | 1/2018 |

OTHER PUBLICATIONS

U.S. Appl. No. 17/202,151, First Named Inventor: Shogo Itai; Title: "Magnetic Memory Device", filed Mar. 15, 2021.

U.S. Appl. No. 17/371,138, First Named Inventor: Masayoshi Iwayama; Title: "Magnetic Memory Device", filed Jul. 9, 2021.

U.S. Appl. No. 17/469,778; First Named Inventor: Hiroshi Takehira; Title: "Switching Device and Resistance Variable Device", filed Sep. 8, 2021.

Bean, et al., "Atomic structure and electronic properties of MgO grain boundaries in tunnelling magnetoresistive devices", Scientific Reports, Apr. 4, 2017, vol. 7, No. 45594, pp. 1-9.

De Vita, et al., "Defect energetics in MgO treated by first-principles methods", Physical Review B, Nov. 11, 1992, vol. 46, No. 20, 13 pages.

Gibson, et al., "Stability of vacancy defects in MgO: The role of charge neutrality", Physical Review B, Jul. 15, 1994, vol. 7, No. 4, pp. 2582-2592.

Harris, et al., "Computer simulation of pressure-induced structural transitions in MgO [001] tilt grain boundaries", American Mineralogist, 1999, vol. 84, pp. 138-143.

Jung, et al., "Electrical properties of plasma display panel with Mg1-xZnxO protecting thin films deposited by a radio frequency magnetron sputtering method", Applied Physics Letters, Apr. 6, 2005, vol. 86, pp. (153503-1)-(153503-3).

McKenna, et al., "First-principles calculations of defects near a grain boundary in MgO", Physical Review B (vol. 79, No. 22), 2009, p. 224116 (11 pages), DOI: 10.1103/PhysRevB.79.224116.

Richter, "Defect complexes in Li-doped MgO", Physical Review B (vol. 91, No. 19), 2015, p. 195305 (11 pages), DOI: 10.1103/PhysRevB.91.195305.

Wang, et al., "Atom-resolved imaging of ordered defect superstructures at individual grain boundaries", Nature (vol. 479, No. 7373), 2011, pp. 380-383, DOI: 10.1038/nature10593.

Watson, et al., "Atomistic simulation of dislocations, surfaces and interfaces in MgO", Journal of the Chemical Society, Faraday Transactions, 1996, vol. 92, No. 3, pp. 433-438.

* cited by examiner

MAGNETIC MEMORY DEVICE WITH NONMAGNETIC LAYER HAVING TWO ADDITIVE ELEMENTS

CROSS-REFERENCE TO RELATED APPLICATIONS

This application is a Continuation-in-Part Application of U.S. patent application Ser. No. 16/570,020, filed Sep. 13, 2019 and based upon and claiming the benefit of priority from Japanese Patent Application No. 2019-052166, filed Mar. 20, 2019, the entire contents of all of which are incorporated herein by reference.

FIELD

Embodiments described herein relate generally to a magnetic memory device.

BACKGROUND

A magnetic memory device using a magnetoresistive element as a storage element is suggested. In general, the magnetoresistive element has a stacked structure including a storage layer, a reference layer and a tunnel barrier layer provided between the storage layer and the reference layer.

To obtain a magnetoresistive element with excellent characteristics, the improvement of the characteristics of the tunnel barrier layer is important.

However, a tunnel barrier layer with excellent characteristics cannot be always obtained because of a defect or crystal grain boundary included in the tunnel barrier layer.

Thus, there is a demand for a magnetic memory device including a magnetoresistive element comprising a tunnel barrier layer having excellent characteristics in which a defect or crystal grain boundary is compensated both electrically and spatially.

DETAILED DESCRIPTION

In general, according to one embodiment, a magnetic memory device including a stacked structure including: a first magnetic layer having a variable magnetization direction; a second magnetic layer having a fixed magnetization direction; and a nonmagnetic layer provided between the first magnetic layer and the second magnetic layer, and containing magnesium (Mg) and oxygen (O). The nonmagnetic layer further contains a first additive element and a second additive element, the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg), and the second additive element is lithium (Li).

Embodiments will be described hereinafter with reference to the accompanying drawings.

Figure 1:
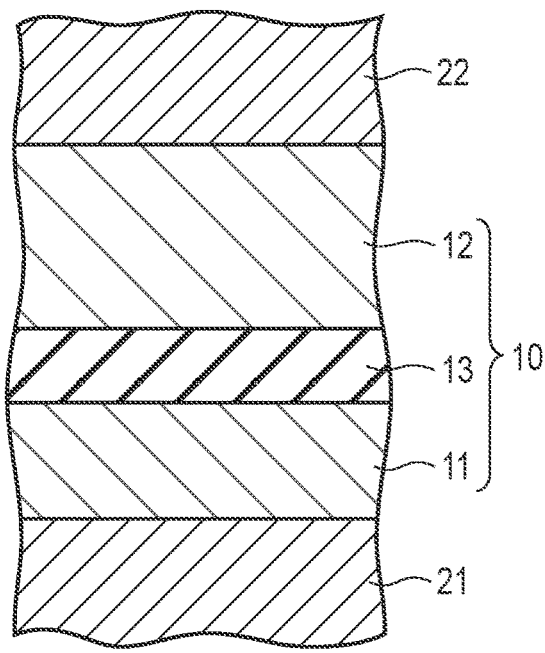
FIG. 1 is a cross-sectional view schematically showing an example of a magnetic memory device according to an embodiment.

FIG. 1 is a cross-sectional view schematically showing the structure of a magnetic memory device according to an embodiment.

As shown in FIG. 1, a stacked structure 10 functioning as a magnetoresistive element is provided on a bottom structure (not shown) including a semiconductor substrate, a transistor, a conductive line, etc. A bottom electrode 21 and a top electrode 22 are connected to the ends of the stacked structure 10. The magnetoresistive element is also called a magnetic tunnel junction (MTJ) element. The stacked structure 10 includes a storage layer (first magnetic layer) 11, a reference layer (second magnetic layer) 12 and a tunnel barrier layer (nonmagnetic layer) 13.

The storage layer (first magnetic layer) 11 has a variable magnetization direction. When the magnetization direction is variable, the magnetization direction changes for a predetermined write current. The storage layer 11 contains iron (Fe) and boron (B). The storage layer 11 may contain cobalt (Co) in addition to iron (Fe) and boron (B).

The reference layer (second magnetic layer) 12 has a fixed magnetization direction. When the magnetization direction is fixed, the magnetization direction does not change for a predetermined write current. The reference layer 12 includes a first sublayer in contact with the tunnel barrier layer 13, and a second sublayer provided on the first sublayer. The first sublayer contains iron (Fe) and boron (B). The first sublayer may contain cobalt (Co) in addition to iron (Fe) and boron (B). The second sublayer contains cobalt (Co) and at least one element selected from platinum (Pt), nickel (Ni) and palladium (Pd). Specifically, the second sublayer is formed of a super lattice of, for example, Co/Pt, Co/Ni or Co/Pd.

The tunnel barrier layer (nonmagnetic layer) 13 is an insulating layer provided between the storage layer 11 and the reference layer 12. The tunnel barrier layer 13 contains magnesium (Mg) and oxygen (O). Thus, the main component of the tunnel barrier layer 13 is magnesium oxide (MgO). The details of the tunnel barrier layer 13 are explained later.

The resistance of the magnetoresistive element in a parallel state where the magnetization direction of the storage layer 11 is parallel to the magnetization direction of the reference layer 12 is less than that in an antiparallel state where the magnetization direction of the storage layer 11 is antiparallel to the magnetization direction of the reference layer 12. In other words, when the magnetization direction is in a parallel state, the magnetoresistive element is in a low resistive state. When the magnetization direction is in an antiparallel state, the magnetoresistive element is in a high resistive state. In this way, the magnetoresistive element is capable of storing binary data (0 or 1) based on the resistive state (the low resistive state or the high resistive state).

The above magnetoresistive element is a spin-transfer-torque (STT) magnetoresistive element and has perpendicular magnetization. Thus, the magnetization direction of the storage layer 11 is perpendicular to its main surface. The magnetization direction of the reference layer 12 is perpendicular to its main surface.

Figure 2:
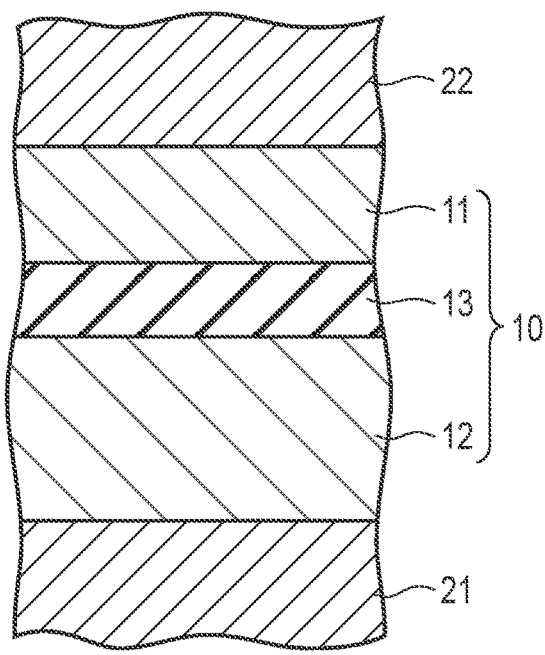
FIG. 2 is a cross-sectional view schematically showing another example of the magnetic memory device according to the embodiment.

The magnetoresistive element shown in FIG. 1 has a bottom-free structure in which the storage layer 11 is provided on the lower side with respect to the reference layer 12. However, as shown in FIG. 2, the magnetoresistive element may have a top-free structure in which the reference layer 12 is provided on the lower side with respect to the storage layer 11.

A shift canceling layer having a function of canceling the magnetic field applied by the reference layer 12 to the storage layer 11 may be further stacked in the stacked structure 10 of the magnetoresistive element. An under layer and a cap layer may be further provided in the stacked structure 10.

Now, the details of the tunnel barrier layer (nonmagnetic layer) 13 are explained.

As explained above, when a defect or crystal grain boundary is included in the tunnel barrier layer, the characteristics of the tunnel barrier layer may be degraded. When magnesium oxide (MgO) is used for the tunnel barrier layer 13, a defect (magnesium (Mg) vacancy, oxygen (O) vacancy, etc.) and crystal grain boundary are considered to be present. Thus, to obtain an excellent tunnel barrier layer, the effective compensation of a defect or crystal grain boundary both electrically and spatially is important.

To compensate the above defect or crystal grain boundary, the tunnel barrier layer (nonmagnetic layer) 13 of the present embodiment contains at least one kind of additive element as described below in addition to magnesium (Mg) and oxygen (O).

As the first example, the tunnel barrier layer 13 contains an additive element selected from fluorine (F), sulfur (S), hydrogen (H) and lithium (Li).

The above additive elements are effective in the compensation of the defect of magnesium oxide (MgO) which is the main component of the tunnel barrier layer 13. Specifically, the above additive elements are capable of compensating the magnesium (Mg) vacancy or oxygen (O) vacancy of magnesium oxide (MgO) both electrically and spatially. No deep bap state is formed in the band, gap (energy gap) of magnesium oxide (MgO). Thus, the crystallinity of the tunnel barrier layer 13 can be improved. Further, the leak current of the tunnel barrier layer 13 can be prevented.

When hydrogen (H) is used for the above additive element, as described later, hydrogen (H) is also effective in the compensation of grain boundaries (in other word, boundary gap filling or boundary segregation).

As the second example, the tunnel barrier layer 13 contains a first additive element and a second additive element. A combination of the first additive element and the second additive element is selected from a combination of lithium (Li) and fluorine (F), a combination of aluminum (Al) and nitrogen (N), a combination of gallium (Ga) and nitrogen (N), a combination of nitrogen (N) and fluorine (F), a combination of nitrogen (N) and hydrogen (H), a combination of hydrogen (H) and fluorine (F) and a combination of aluminum (Al) and lithium (Li).

The above combinations of the first additive element and the second additive element are effective in at least one of the compensation of the defect of magnesium oxide (Mg) which is the main component of the tunnel barrier layer 13 and the compensation of the grain boundaries (boundary gap filling or boundary segregation) of magnesium oxide (MgO). Additional explanations are provided below.

In a combination in which the ratio of lithium (Li) to fluorine (F) is 1 to 1 (hereinafter, may be abbreviated as Li—F pair), Li compensates magnesium (Mg) vacancy, and F compensates oxygen (O) vacancy. Thus, a charge compensation pair is formed. Li—F pair is also effective in the compensation of grain boundaries (boundary gap filling or boundary segregation). With respect to the compensation of grain boundaries (boundary gap filling or boundary segregation), the position of a conduction band edge and the position of a valence band edge are important. In general, defective MgO tends to lowering its conduction band edge and raising its valence band edge. Therefore, it is the most desirable that, when an additive element is added to defective MgO containing vacancies or grain boundaries, the position of the conduction band edge should go up, and further, the position of the valence band edge should go down. However, it is effective even when only the position of the conduction band edge goes up. Since the position of the conduction band edge goes up by adding Li and F to defective MgO with grain boundaries, Li—F is also effective in the compensation of grain boundaries (boundary gap filling or boundary segregation).

In a combination in which the ratio of aluminum (Al) to nitrogen (N) is 1 to 1 (hereinafter, may be abbreviated as Al—N pair), Al compensates Mg vacancy, and N compensates O vacancy. Thus, a charge compensation pair is formed. Since the position of the conduction band edge goes up by adding Al and N to defective MgO with grain boundaries (boundary gap filling or boundary segregation), Al—N pair is also effective in the compensation of grain boundaries.

In a combination in which the ratio of gallium (Ga) to nitrogen (N) is 1 to 1 (hereinafter, may be abbreviated as Ga—N pair), Ga compensates Mg vacancy, and N compensates O vacancy. Thus, a charge compensation pair is formed.

In a combination in which the ratio of nitrogen (N) to fluorine (F) is 1 to 1 (hereinafter, may be abbreviated as N—F pair), N compensates O vacancy, and F also compensates O vacancy at another site. Thus, a charge compensation pair is formed.

In a combination in which the ratio of nitrogen (N) to hydrogen (H) is 1 to 1 (hereinafter, may be abbreviated as N—H pair), N compensates O vacancy, and H also compensates O deficiency vacancy at another site. Thus, a charge compensation pair is formed.

In a combination in which the ratio of hydrogen (H) to fluorine (F) is 1 to 1 (hereinafter, may be abbreviated as H—F pair), H enters a lattice, and F compensates O vacancy. Thus, a charge compensation pair is formed.

In a combination of aluminum (Al) and lithium (Li), extra oxygen (O) is added in addition to Al and Li (in other words, extra oxygen (O) is contained in comparison with stoichiometric MgO). Substantially, $AlLiO_2$ is added to MgO. This combination is equivalent to charge compensated co-addition (co-doping), in other words, co-addition (co-doping) of $(Al_2O_3 \cdot Li_2O) \times (½)$ according to stoichiometry. The combination can cause charge compensation effects and is effective in the compensation of grain boundaries (boundary gap filling or boundary segregation). Since the position of the conduction band edge goes up by adding $AlLiO_2$ to defective MgO, this combination is effective in the compensation of grain boundaries (boundary gap filling or boundary segregation).

The fluorine (F) explained as the first example also functions as F—F pair. One F compensates O vacancy, and the other F enters a lattice as an interstitial F atom. Thus, a charge compensation pair is formed.

Similarly, the hydrogen (H) explained as the first example also functions as H—H pair. One H compensates O vacancy, and the other H enters a lattice as an interstitial H atom. Thus, a charge compensation pair is formed. Since the position of the conduction band edge goes up by adding H—H pair to MgO, H—H pair is also effective in the compensation of grain boundaries (boundary gap filling or boundary segregation).

When the first and second additive elements are contained in the tunnel barrier layer 13 like the second example, charge compensation effects can be obtained. For example, this specification explains a case where Al—N pair is used for the first and second additive elements. Mg and O are divalent elements. Al and N are trivalent elements. Thus, when Al merely substitutes an Mg site, one electron is excessive. When N merely substitutes an O site, one electron is insufficient. By adding Al—N pair, there is no excess or deficiency in the number of electrons. Thus, charge compensation effects can be achieved.

Now, this specification explains the ratio of the additive element in the tunnel barrier layer 13.

In the first example, the ratio of the additive element in the tunnel barrier layer 13 is preferably less than or equal to 5 at % and greater than or equal to 0.002 at %. Thus, the ratio of the number of atoms of the additive element to the total number of atoms of the magnesium (Mg), oxygen (O) and additive element contained in the tunnel barrier layer 13 is preferably less than or equal to 5 at % and greater than or equal to 0.002 at %.

In the second example, the ratio of the first additive element in the tunnel barrier layer 13 is preferably less than or equal to 5 at % and greater than or equal to 0.002 at %. The ratio of the second additive element in the tunnel barrier layer 13 is preferably less than or equal to 5 at % and greater than or equal to 0.002 at %. Thus, the ratio of the number of atoms of each of the first and second additive elements to the total number of atoms of the magnesium (Mg), oxygen (O) and first and second additive elements contained in the tunnel barrier layer 13 is preferably less than or equal to 5 at % and greater than or equal to 0.002 at %.

The ratio of the additive element is explained in more detail below.

The atomic distance between Mg and O in MgO is approximately 0.21 nm (namely lattice constant of MgO). When the dimension (diameter or the length of each side of the square) of the magnetoresistive element (in other words, the diameter or the length of each side of the tunnel barrier layer) is approximately 20 nm, the area of the magnetoresistive element (in other words, the area of the tunnel barrier layer) is approximately $10 \times 10 \times 3.14 = 314$ nm$^2$ or $20 \times 20 = 400$ nm$^2$. Each of the number of Mg atoms and the number of O atoms per unit cell of MgO lattice is 0.5. The area of the unit cell of MgO is approximately $0.21 \times 0.21 = 0.0441$ nm$^2$. Thus, each of the number of Mg atoms and the number of O atoms present in one monolayer of the MgO tunnel barrier layer having a diameter of 20 nm or a side of 20 nm square in length is $0.5 \times 314/0.0441 = 3560.1$ or $0.5 \times 400/0.0441 = 4535.1$. To realize a tunnel barrier with high breakdown voltage and low tunnel resistance is assumed, it is preferable that the upper limit of the thickness of the MgO tunnel barrier layer should be approximately seven monolayers. When a single Mg vacancy or a single O vacancy is present in the seven monolayers of the MgO tunnel barrier layer, each of the ratio of the Mg vacancy to the number of Mg atoms (the density of Mg vacancy) and the ratio of the O vacancy to the number of O atoms (the density of O vacancy) is $((1/3560.1)/7) \times 100 = 0.0040$ at % (in the cylinder shape case) or $((1/4535.1)/7) \times 100 = 0.0032$ at % (in the square shape case). When the above vacancy is compensated by the additive element, the ratio of the additive element to the number of Mg atoms is greater than or equal to 0.004 at % or 0.003 at %. The ratio of the additive element to the number of O atoms is also greater than or equal to 0.004 at % or 0.003 at %. Thus, the ratio of the sum of additive elements to the total number of atoms (Mg+O) in the MgO tunnel barrier layer is greater than or equal to 0.002 at %.

With regard to a case where Li—F pair is added to MgO, the following fact is confirmed by first-principles calculations. No defect level is generated in the band gap (energy gap) both when the ratio of Li in MgO is less than or equal to 5 at % and when the ratio of F in MgO is less than or equal to 5 at %, in other words, when each of the ratio of the number of Li atoms and the ratio of the number of F atoms to the total number of Mg, O, Li and F atoms contained in the tunnel barrier layer is less than or equal to 5 at %. Moreover, the characteristics of co-doping of the other pairs of additive elements are similar to the above. Thus, with regard to the other pairs of additive elements, in the first example, the ratio of the additive element in the tunnel barrier layer is preferably less than or equal to 5 at %. In the second example, the ratio of each of the first and second additive elements in the tunnel barrier layer is preferably less than or equal to 5 at %.

Regarding the typical grain boundaries included in the doped MgO, namely, the {210} symmetric tilt grain boundaries, the {310} symmetric tilt grain boundaries, the {410} symmetric tilt grain boundaries, the {510} symmetric tilt grain boundaries, the {710} symmetric tilt grain boundaries, the {910} symmetric tilt grain boundaries and the {520} symmetric tilt grain boundaries, the estimation of the element additive amount necessary to fill the gap space of the grain boundaries is as follows.

When it is assumed that the magnetoresistive element (MTJ element) has a square shape in which each side is 20 nm in length, the element area S of the MTJ element is 20 nm×20 nm=400 nm$^2$. The number of Mg or O atoms per unit cell is 0.5. The area ΔS of the unit cell is 0.21 nm×0.21 nm=0.0441 nm$^2$. When the MgO tunnel barrier layer is (001) oriented in the normal direction and the thickness of the MgO tunnel barrier layer is one monolayer, the number N of Mg or O atoms present in the MgO tunnel barrier layer of the MTJ element having a square shape in which each side is 20 nm in length is $0.5 \times 400$ nm$^2$/0.0441 nm$^2$=4535.1. When it is assumed that the MgO consists of square crystal grains whose side is 5 nm in length, the total extension L of the grain boundaries present in the MTJ element is $20 \times 4 + 20 \times 4 = 160$ nm.

Here, in the case of the {210} symmetric tilt grain boundaries, the length ΔL of a single grain boundary is $5^{1/2} \times 0.21$ nm. Thus, in the MTJ element, 160 nm/($5^{1/2} \times 0.21$ nm)=340.7 UNIT grain boundaries are present. The first-principles calculation reveals that, if an element expected to obtain the grain boundary compensation (boundary gap filling or boundary segregation) effect for the gap space of all the grain boundaries is to be added, one element-pair (one MgO pair, corresponding to two atoms) can enter the {210} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus the density of the dopant-pair is approximately $(340.7 \times 1/4535.1) \times 100 = 7.5$ mol %.

In the case of the {310} symmetric tilt grain boundaries, the length ΔL of a single grain boundary is $10^{1/2} \times 0.21$ nm. Thus, in the MTJ element, 160 nm/($10^{1/2} \times 0.21$ nm)=240.9 UNIT grain boundaries are present. The first-principles calculation reveals that, if an element expected to obtain the grain boundary compensation (boundary gap filling or boundary segregation) effect for the gap space of all the grain boundaries is to be added, two element-pairs (two MgO pairs, corresponding to four atoms) can enter the {310} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(240.9 \times 2/4535.1) \times 100 = 10.6$ mol %.

In the case of the {410} symmetric tilt grain boundaries, the length $\Delta L$ of a single grain boundary is $17^{1/2} \times 0.21$ nm. Thus, in the MTJ element, $160$ nm$/(17^{1/2} \times 0.21$ nm$) = 184.8$ UNIT grain boundaries are present. The first-principles calculation reveals that, if an element expected to obtain the grain boundary compensation (boundary gap filling or boundary segregation) effect for the gap space of all the grain boundaries is to be added, two element-pairs (two MgO pairs, corresponding to four atoms) can enter the {410} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(184.8 \times 2/4535.1) \times 100 = 8.1$ mol %.

In the case of the {510} symmetric tilt grain boundaries, the length $\Delta L$ of a single grain boundary is $26^{1/2} \times 0.21$ nm. Thus, in the MTJ element, $160$ nm$/(26^{1/2} \times 0.21$ nm$) = 149.4$ UNIT grain boundaries are present. The first-principles calculation reveals that, if an element expected to obtain the grain boundary compensation (boundary gap filling or boundary segregation) effect for the gap space of all the grain boundaries is to be added, three element-pairs (three MgO pairs, corresponding to six atoms) can enter the {510} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(149.4 \times 3/4535.1) \times 100 = 9.9$ mol %.

In the case of the {710} symmetric tilt grain boundaries, the length $\Delta L$ of a single grain boundary is $50^{1/2} \times 0.21$ nm. Thus, in the MTJ element, $160$ nm$/(50^{1/2} \times 0.21$ nm$) = 107.7$ UNIT grain boundaries are present. The first-principles calculation reveals that, if an element expected to obtain the grain boundary compensation (boundary gap filling or boundary segregation) effect for the gaps of all the grain boundaries is to be added, four element-pairs (four MgO pairs, corresponding to eight atoms) can enter the {710} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(107.7 \times 4/4535.1) \times 100 = 9.5$ mol %.

In the case of the {910} symmetric tilt grain boundaries, the length $\Delta L$ of a single grain boundary is $82^{1/2} \times 0.21$ nm. Thus, in the MTJ element, $160$ nm$/(82^{1/2} \times 0.21$ nm$) = 84.1$ UNIT grain boundaries are present. The first-principles calculation reveals that, if an element expected to obtain the grain boundary compensation (boundary gap filling or boundary segregation) effect for the gap space of all the grain boundaries is to be added, six element-pairs (six MgO pairs, corresponding to 12 atoms) can enter the {910} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(84.1 \times 6/4535.1) \times 100 = 11.1$ mol %.

In general, when the lower limit of the grain diameter of MgO which exhibits a high TMR (Tunnel Magneto Resistance) ratio is approximately 5 nm, in the {310} symmetric tilt grain boundaries, for example, the density of the dopant-pair is approximately 10.6 mol %. Thus, the density of the dopant-pair is approximately 10 mol %. Accordingly, the upper limit of the additive element-pair is considered as approximately 10 mol % of the MgO matrix. In terms of the compensation of grain boundaries (boundary gap filling or boundary segregation), it is preferable that the upper limit of the element-pair added to MgO should be approximately 10 mol %.

In the case of the {520} symmetric tilt grain boundaries, the length $\Delta L$ of a single grain boundary is $29^{1/2} \times 0.21$ nm. Thus, in the MTJ element, $160$ nm$/(29^{1/2} \times 0.21$ nm$) = 141.6$ UNIT grain boundaries are present. The first-principles calculation reveals that, if an element expected to obtain the grain boundary compensation (boundary gap filling or boundary segregation) effect for the gaps of all the grain boundaries is to be added, eight element-pairs (eight MgO pairs, corresponding to 16 atoms) can enter the {520} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(141.6 \times 8/4535.1) \times 100 = 25.0$ mol %. However, in reality, the {520} symmetric tilt grain boundaries are not solely or evenly present. Grain boundaries having a small gap such as the {210} symmetric tilt grain boundaries are also probably co-existing. Thus, the additive amount of the element-pair necessary to fill the grain boundaries in the MTJ element is considered to be less than 25.0 mol %. When the additive amount exceeds 10 mol %, the TMR ratio is usually decreased. Therefore, even if the presence of the {520} symmetric tilt grain boundaries is assumed, it is preferable that the upper limit of the element-pair added to MgO should be approximately 10 mol %.

An effect of intrinsic defects (magnesium vacancy or oxygen vacancy) on the TMR ratio and RA (resistance-area product) in an MTJ of Fe/MgO/Fe structure and an effect of element addition for compensating the above intrinsic defects on the TMR ratio and RA, is evaluated by the first-principles non-equilibrium Green's function calculations. The calculations reveal the facts described below. The O vacancy degrades the TMR ratio by an increase of leakage current of electron tunneling in an antiparallel spin state. However, the Mg vacancy does not cause such a negative influence. Regarding cation doping (compensation for an Mg vacancy by an additive cation), although Al single doping may reduce the TMR ratio, Li single doping does not cause such a negative influence. Since the number of valence electrons of Al is greater than the number of those of Mg by one, and the excessive electron has higher energy than a Fermi level of the Fe electrode, the excessive electron is released to the Fe electrode and enters to a hybrid orbital of Al—Fe bond, and promotes Fe wave functions penetrating into the interface state in the MgO side and increases leakage current of electron tunneling in an antiparallel spin state. On the other hand, since the number of valence electrons of Li is smaller than those of Mg by one, one electron is extracted from the Fe electrode, and the density of state of Fe in the Fe electrode is reduced, that is, a hole is produced. In this case, different from the case of Al single doping, since penetration of Fe wave functions into the interface states in the MgO side is not promoted, Li single doping exhibits a TMR characteristic equivalent to that of non-defective MgO. Regarding the anion doping (compensation for an O vacancy by an additive anion), N single doping is expected to improve the TMR ratio significantly, whereas F single doping may reduce the TMR ratio. Since the number of valence electrons of N is smaller than those of O by one, filling the oxygen vacancy by N atom compensates gap defect level of the excessive electrons, and improvement of the TMR ratio is expected significantly. On the other hand, since the number of valence electrons of F is greater than those of O by one, and the excessive electron has higher energy than a Fermi level of the Fe electrode, the excessive electron is released to the Fe electrode by filling the O vacancy with F. Only this fact should exhibit a TMR characteristic equivalent to that of the non-defective MgO similar to the case of Li single doping. However, in the case of F, a large structural deformation is caused in a surrounding region, which reduces the TMR ratio. The above described single doping of cation and anion is performed complementarily, that is, it is performed as charge compensation complexes like Li—F pair or Al—N pair, which realizes a TMR characteristic between the TMR ratio and RA equivalent to that of the non-defective MgO, and the MTJ characteristics can be improved.

Now, this specification explains a method for adding a single or a plurality of additive elements to the tunnel barrier layer (MgO tunnel barrier layer) 13.

In a first method, an MgO layer to which an additive element is added is deposited by a sputtering method or an evaporation method using an MgO target to which the additive element is added. As the method for adjusting the additive amount of the additive element, the following methods are considered: a method using a plurality of MgO targets in which the composition of the additive element is adjusted; a method of performing co-sputtering using an MgO target in which the composition of the additive element is fixed and an MgO target to which the additive element is not added; and a deposition method of alternately using an MgO target in which the composition of the additive element is fixed and an MgO target to which the additive element is not added.

In a second method, a substrate is exposed to oxidizing atmosphere using an Mg target to which an additive element is added after an Mg layer to which the additive element is added is deposited or while an Mg layer to which the additive element is added is deposited. As the method for adjusting the additive amount of the additive element, the following methods are considered: a method using a plurality of Mg targets in which the composition of the additive element is adjusted; a method of performing co-sputtering using an Mg target in which the composition of the additive element is fixed and an Mg target to which the additive element is not added; and a deposition method of alternately using an Mg target in which the composition of the additive element is fixed and an Mg target to which the additive element is not added.

In a third method, one or more chips including additive element is attached onto an MgO target. An MgO layer to which the additive element is added is deposited by a sputtering method or an evaporation method. The additive amount of the additive element can be controlled by adjusting the size of the chips of the additive element. Several kinds of chips including different additive elements can also be attached onto an MgO target to realize co-doping.

The following are additional descriptions for the embodiments.

It is considered that, for example, various types of defects are present in the MgO tunnel barrier layer. Such defects may cause lowering in the TMR ratio. Further, the presence of vacancies, in other words defects, may not only create spatial atomic voids, but also disrupt the charge balance of MgO. For this reason, to compensate for the structural distortion and charge distortion, the crystal structure is distorted and disordered. Due to the disorder of the crystal structure of the MgO tunnel barrier layer, electrons flowing through the tunnel barrier layer are scattered, and the scattering of electrons also lowers the TMR ratio. Therefore, the addition of other appropriate elements is necessary to compensate the structural distortions and charge unbalance induced by defects.

However, depending on the type of defect, the polarity sign of the excess charge differs as well. For example, in the absence of the application of bias, when Mg in MgO is deficient, i.e., a Mg vacancy exists, lack of electrons occur, whereas when O is deficient, i.e., an O vacancy exists, excess of electrons occurs. If either one type of vacancy is present in MgO, it suffices if a charge compensating one element appropriate for compensating for the electronic unbalance is added. In practice, however, Mg vacancy and O vacancy can occur at the same time. Therefore, it is important to add a combination of elements, namely, a charge compensation pair to MgO to compensate for the coexisting vacancies, so as to compensate for the electronic unbalance caused by vacancies in MgO.

Note also that some additive elements can be stabilized not only by substituting the vacancy sites but also by staying at interstitial sites of MgO. Further, by staying at interstitial sites, an additional electronic charge can be introduced, and therefore such elements can also be combination elements of charge compensation pairs.

In other words, a charge-compensation pair is a charge-neutral pair by which lack or excess of electrons generated when one or more elements compensate for the Mg or O vacancy in the MgO tunnel barrier layer, can be cancelled out by some other one or more elements entering the Mg vacancy, O vacancy or interstitial sites.

The charge compensation pair is not limited to two type of elements. For example, a charge-compensation pair can also be formed when three or more elements are added, such as 2Li—S—Al. Or, as will be described later, a charge-compensation pair can also be formed when one type of element is added, such as S—S.

Here, the case where, for example, Al and N are used as the first and second additive elements will be discussed. Mg and O are divalent elements, and Al and N are trivalent elements. Therefore, if only Al atom substitutes for an Mg site, that is, the Mg vacancy is only compensated for by Al, a state of excess by one electron is created. Or, if only N atom substitutes for an O site, that is, the O vacancy is only compensated for by N, a state of lack by one electron is created. Therefore, by adding both Al and N, not only the spatial vacancy can be compensated for, but also the excess and lack of electrons can be eliminated, thus making it possible to achieve the charge compensation effect.

Next, how easily atoms can enter defect sites will be described.

As to the atoms that give rise to a charge-compensation pairs, there is such a tendency that cationic atoms in the charge-compensation pair can easily enter the Mg vacancy formed when the cationic atom, Mg is removed, whereas anionic atoms in the charge-compensation pair can easily enter the O vacancy formed when the anionic atom O is removed. This is because in MgO, which is an ionic crystal, the Mg site is a site that receives electrons from O, that is, it is surrounded by O, which is an anion; therefore cationic atoms can easily enter the Mg vacancy by Coulomb interaction, while the O site is the opposite case. Based on this study, according to this embodiment, the defect formation energies of the additional atoms constituting the charge-compensation pair when they enter the appropriate sites of the Mg vacancy, O vacancy or interstitial sites were calculated by first-principles calculations for each atom. Here, it has been confirmed that the formation of charge compensation pairs stabilizes the system energetically even when the atoms introduced into the system alone or isolated from other additive elements bring about energetically unstable state.

The states of excess and lack of electrons when each defect site is compensated for by additive elements as the additional atoms takes the most stable structure in the vacancy or interstitial sites (that is, a combination of excess and lack of electrons caused by the compensation) will be discussed.

In the case of excess of electrons, the states are as follows.

The cases where the electrons are excessive and cation is added to the Mg vacancy site are as follows.

The elements that compensate for the Mg vacancy, in which the electrons are excessive by one electron at the maximum, are cationic elements that can easily take trivalence, such as Al and Ga.

The elements that compensate for the Mg vacancy, in which the electrons are excessive by two at the maximum, are cationic elements which tend to become tetravalent, such as Mn, S and Ti.

The elements that compensate for the Mg vacancy, in which the electrons are excessive by three at the maximum, are cationic elements which tend to become pentavalent, that is, for example, V.

The cases where the electrons are excessive and anion is added to the O vacancy site are as follows.

The elements that compensate for the O vacancy, in which the electron is excessive by one at the maximum, are anionic elements which tend to become monovalent, that is, for example, F.

The cases where the electrons are excessive and cation is added to the O vacancy site are as follows. Note that H exhibits amphoteric character electronically, but it is applied as cation in the following descriptions.

The elements that compensates for the O vacancy, in which the electrons are excessive by two at the maximum, are, for example, Al and H.

The elements that compensate for the O vacancy, in which the electrons are excessive by three at the maximum, are, for example, Ga, Li, and V.

The elements that compensate for the O vacancy, in which the electrons are excessive by four at the maximum, are, for example, Mn and Ti.

The cases where the electrons are excessive and elements are added to interstitial sites are as follows.

The elements that enter the interstitial sites, in which the electrons are excessive by one at the maximum, are, for example, Li, N and H.

The elements that enter the interstitial sites, in which the electrons are excessive by two at the maximum, are, for example, Mg, Mn and S.

The elements that enter the interstitial sites, in which the electrons are excessive by three at the maximum, are, for example, Al, Ga and V.

The elements that enter the interstitial sites, in which the electrons are excessive by four at the maximum, are, for example, Ti.

In the case of lack of electrons, the states are as follows.

The cases where the electrons are deficient and cation is added to the Mg vacancy site are as follows.

The elements that compensate for the Mg vacancy, in which the electrons are deficient by one at the maximum are cationic elements which tend to become monovalent, for example, Li.

The cases where the electrons are deficient and anion is added to the Mg vacancy site are as follows.

The another element that compensate for the Mg vacancy, in which the electrons are deficient by one at the maximum, are for example, S.

The elements that compensate for the Mg vacancy, in which the electrons are deficient by two at the maximum, are for example, F.

The elements that compensate for the Mg vacancy, in which the electrons are deficient by three at the maximum, are, for example, O.

The cases where the electrons are deficient and anion is added to the O vacancy site are as follows.

The elements that compensate for the O vacancy, in which the electrons are deficient by one at the maximum, are anionic elements which tend to become trivalent, for example, N.

The cases where the electrons are deficient and anion is added to an interstitial site are as follows.

The elements that enters the interstitial sites, in which the electrons are deficient by one at the maximum are, for example, F.

The elements that enters the interstitial sites, in which the electrons are deficient by two at the maximum are, for example, S.

Thus, a combination that eliminates the excess or deficiency of electrons as described above in the addition of single elements, i.e., simple doping, or multiple elements, i.e., co-doping, is a charge-compensation pair that can be expected to exhibit a charge-compensation effect. Examples of the charge compensation pair are as follows.

Examples of the charge compensation pair of an element added to a Mg vacancy and an element added to an O vacancy are as follows.

In a combination of gallium (Ga) and nitrogen (N) at a ratio of 1:1 (to be abbreviated as Ga_Mg—N_O, hereinafter), Ga compensates for the Mg vacancy (abbreviated as Ga_Mg) and N compensates for the O vacancy (abbreviated as N_O), thus forming a charge compensation pair.

In a combination of titanium (Ti) and nitrogen (N) at a ratio of 1:1, Ti compensates for the Mg vacancy (abbreviated Ti_Mg) and N compensates for the O vacancy (abbreviated N_O), thus forming a charge compensation pair(, which may be abbreviated as Ti_Mg—N_O hereinafter.)

In a combination of fluorine (F) and sulfur (S) at a ratio of 1:1, S compensates for the Mg vacancy (abbreviated as S_Mg) and F compensates for the O vacancy (abbreviated as F_O), thus forming a charge compensation pair(, which may be abbreviated as S_Mg—F_O hereinafter).

Examples of the charge-compensation pair of an element added to an O vacancy and an element added to an O vacancy are as follows.

In the combination of nitrogen (N) and hydrogen (H) at a ratio of 1:1, N compensates for the O vacancy (abbreviated as N_O) and H also compensates for the O vacancy (abbreviated as H_O), thus forming a charge compensation pair (which may be abbreviated as N_O—H_O hereinafter).

In the combination of nitrogen (N) and fluorine (F) at a ratio of 1:1, N compensates for the O vacancy (abbreviated as N_O) and F also compensates for the O vacancy (abbreviated as F_O), thus forming a charge compensation pair (which may be abbreviated as N_O—F_O hereinafter).

Examples of the charge compensation pair of an element added to an Mg vacancy and an element added to an Mg vacancy are as follows.

In the combination of lithium (Li) and gallium (Ga) at a ratio of 1:1, Li compensates for the Mg vacancy (abbreviated as Li_Mg) and Ga also compensates for the Mg vacancy (abbreviated as Ga_Mg), thus forming a charge compensation pair (which may be abbreviated as Li_Mg—Ga_Mg).

In the combination of lithium (Li) and titanium (Ti) at a ratio of 1:1, Li compensates for the Mg vacancy (abbreviated as Li_Mg) and Ti compensates for the Mg vacancy (abbreviated as Ti_Mg), thus forming a charge compensation pair (which may be abbreviated as Li_Mg—Ti_Mg hereinafter).

Examples of the charge compensation pair of an element added to an interstitial site and an element added to an O vacancy are as follows.

In the combination of hydrogen (H) and fluorine (F) at a ratio of 1:1, H enters the interstitial site (abbreviated as H_i) and F compensates for the O vacancy (abbreviated as F_O), thus forming a charge compensation pair (which may be abbreviated as H_i-F_O hereinafter).

In the combination of nitrogen (N) and hydrogen (H) at a ratio of 1:1, N compensates for the O vacancy (abbreviated as N_O) and H enters the interstitial site (H_i), thus forming a charge compensation pair (which may be abbreviated as N_O—H_i hereinafter).

In the combination of nitrogen (N) and magnesium (Mg) at a ratio of 2:1, N compensates for the O vacancy (abbreviated as N_O) and Mg enters the interstitial site (Mg_i), thus forming a charge compensation pair (which may be abbreviated as 2N_O—Mg_i hereinafter).

In the combination of sulfur (S) and nitrogen (N) at a ratio of 1:1, S enters the interstice (abbreviated as S_i) and N compensates for the O vacancy (abbreviated as N_O), thus forming a charge compensation pair (which may be abbreviated as S_i-N_O hereinafter).

Examples of the charge compensation pair of an element added to an interstitial site and an element added to an Mg vacancy are as follows.

In the combination of fluorine (F) and gallium (Ga) at a ratio of 1:1, F enters the interstitial site (abbreviated as F_i) and Ga compensates for the Mg vacancy (abbreviated as Ga_Mg), thus forming a charge compensation pair (which may be abbreviated as F_i-Ga_Mg hereinafter).

In the combination of fluorine (F) and aluminum (Al) at a ratio of 1:1, F enters the interstitial site (abbreviated as F_i) and Al compensates for the Mg vacancy (abbreviated as Al_Mg), thus forming a charge compensation pair (which may be abbreviated as F_i-Al_Mg hereinafter).

In the combination of lithium (Li) and sulfur (S) at a ratio of 1:1, Li enters the interstitial site (abbreviated as Li_i) and S compensates for the Mg vacancy (abbreviated as S_Mg), thus forming a charge compensation pair (which may be abbreviated as Li_i-S_Mg hereinafter).

In the combination of hydrogen (H) and sulfur (S) at a ratio of 1:1, H enters the interstitial site (abbreviated as H_i) and S compensates for the Mg vacancy (abbreviated as S_Mg), thus forming a charge compensation pair (which may be abbreviated as H_i-S_Mg hereinafter).

In the combination of sulfur (S) and lithium (Li) at a ratio of 1:1, S enters the interstitial site (abbreviated as S_i) and Li compensates for the Mg vacancy (abbreviated as Li_Mg), thus forming a charge compensation pair (which may be abbreviated as S_i-Li_Mg hereinafter).

In the combination of sulfur (S) and sulfur (S) at a ratio of 1:1, S enters the interstitial site (abbreviated as S_i) and S compensates for the Mg vacancy (abbreviated as S_Mg), thus forming a charge compensation pair (which may be abbreviated as S_i-S_Mg hereinafter). This is an example in which a charge compensation pair can be formed even with the same element.

Note that, for example, as to Ti, V and Mn, the valence number can change with a slight change in the Fermi energy of the system, or applied bias, of adjacent electrodes even if the same defect is compensated for.

When titanium (Ti) enters the interstitial site, an excess of four, three or two electrons occurs, and when Ti compensates for the Mg or O vacancy, an excess of one electron occurs. On the other hand, when nitrogen (N) compensates for the O vacancy, a deficiency of one electron occurs. Here, by adjusting the ratio of Ti and N, the excess or deficiency of electrons can be eliminated and the charge compensation effect can be achieved. Therefore, the composition of Ti and N can be adjusted in the above-provided range. Hereinafter, a 1:1 combination may be abbreviated as Ti_i-N_O, and a 4:1 combination may be abbreviated as Ti_i-4N_O.

Now, an example will be provided, in which only the addition of an element to a Mg vacancy or O vacancy cannot compensate for the excess or deficiency of electrons, but when some other element enters the interstitial site, charge is induced, thereby making it possible to result in charge compensation.

When gallium (Ga) only compensates for the Mg vacancy, an excess of one electron occurs, and therefore the charge compensation cannot be achieved. However, when fluorine (F) enters the interstitial site, a deficiency of one electron occurs. Therefore, in this case, Ga alone cannot achieve the charge compensation, and the charge compensation can only be achieved by adding Ga and F. Here, the charge compensation pair of this case is abbreviated as Ga_Mg—F_i.

Examples other than the above are, for example, a combination of at least one element selected from S, Ga, Al, Ti, V and Mn, which compensate for the Mg vacancy to make an excess of electrons, and at least one element selected from F and S, which can enter the interstitial site, or a combination of at least one element selected from Ti, H, F, V, Mn, Li, Al and Ga, which compensate for the O vacancy to make an excess of electrons, and at least one element selected from F and S, which can enter the interstitial site.

Moreover, for the same reasons provided above, some elements may change the valence number or excess or deficiency in electron by compensating for different defects (vacancy or interstitial site). For example, as already referred to, Li is an element that compensates for the O vacancy to make an excess of two electrons at the maximum, an element that enters the interstitial site to make an excess of one electron at the maximum, or an element that compensates for the Mg vacancy to make a deficiency of one electron at the maximum.

Other than Li, there are other elements such as those described above, as described in connection with the variations of excess or deficiency of electrons when each defect site is compensated by the respective additive element by adopting the most stable structure of the additive atoms in the vacancy or interstitial sites.

The examples of the combinations are not limited to those provided above, but the combinations may be any type as long as the excess or deficiency of electrons is eliminated.

Examples of the charge compensation pair other than those provided above are as follows. Here, for example, a charge compensation pair of 3Li—N indicates that it is formed of Li and N and the ratio of elements of the charge compensation pair contained in MgO is 3:1. Note here that this is an ideal ratio of the elements obtained from theoretical calculations, and in practice, the MgO barrier with compensated deficiencies is formed by adjusting the ratio of the elements at a value close to the ideal ratio.

Examples of the combination having one deficiency and one excess of electrons are provided below:

Li—S, Li—Ga, Al—Li, Li—Ti, Li—V, Li—H, Li—F, Li—Mn, Li—N, S—Ga, S—Al, S—Ti, S—V, S—H, S—F, S—Mn, S—N, N—S, N—Ga, N—Al, N—Ti, N—V, N—H, N—F, N—Mn, N—Li, N—N, F—S, F—Ga, F—Al, F—Ti, F—V, F—H, F—F, F—Mn and F—N.

Examples of the combination having (two deficiencies of electrons)×3 and (three excesses of electrons)×2 are provided below:

3F-2V, 3F-2Li, 3F-2Ti, 3F-2Mn, 3F-2Ga, 3F-2Al, 3O-2V, 3O-2Li, 3O-2Ti, 3O-2Mn, 3O-2Ga, 3O-2Al, 3S-2V, 3S-2Li, 3S-2Ti, 3S-2Mn, 3S-2Ga and 3S-2Al.

Examples of the combination of (one deficiency of electrons)×2 and two excesses of electrons are provided below:

2Li—V, 2Li—Li, 2Li—H, 2Li—Al, 2Li—Ga, 2Li—Mg, 2S—S, 2S—H, 2S—Al, 2S—Ga, 2S—Mg, 2O—S, 2O—Ti, 2O—V, 2O—Mn, 2O—Li, 2O—H, 2O—Al, 2O—Ga, 2O—Mg, 2N—Al, 2N—Ga and 2N—Mg.

Examples of the combination of (one deficiency of electrons)×3 and three excesses of electrons are provided below:

4Li, 3O—Li, 3O—Ti, 3O—Mn, 3O—V, 3O—Ga and 3O—Al.

Examples of the combination of two deficiencies of electrons and two excesses of electrons are provided below:

O—S, O—Ti, O—V, O—Mn, O—Li, O—H, O—Al, O—Ga.

Examples of the combination of (one deficiency of electrons)×2, one excess and one excess of electrons are provided below:

2Li—S—Ti, 2Li—S—V, 3Li—S, 2Li—Ga—S, Ga—Li, 2Li—Ga—Ti, 2Li—Ga—V, 2Li—Ga—H, 2Li—Ga—Mn, 2Li—Ga—Li, 2Li—Ga—N, 2Li—Al—S, 2Li—Al—Ga, 2Li—Al—Ti, 2Li—Al—V, 2Li—Al—H, 2Li—Al—F, 2Li—Al—Mn, 2Li—Al—Li, 2Li—Al—N, 2Li—Ti—V, 2Li—N—Ti, 2Li—H—S, 2Li—H—Ga, 2Li—H—Ti, 2Li—H—V, 2Li—H—F, 2Li—H—Mn, 2Li—H—N, 2Li—F—S, 2Li—F—Ga, 2Li—F—Ti, 2Li—F—V, 2Li—F—Mn, 2Li—F—N, 2Li—Mn—S, 2Li—Mn—Ti, 2Li—Mn—V, 2Li—Li—Mn, 2Li—Mn—N, 3Li—Ga, 3Li—Al, 3Li—Ti, 3Li—V, 3Li—H, 3Li—F, 3Li—Mn, 3Li—N, 2Li—N—S and 2Li—N—V.

Examples of the combination of (one deficiency of electrons)×2, one excess of electrons and one excess of electrons are provided below:

3S—Ga, 3S—Al, 3S—Ti, 2S—V, 3S—H, 3S—F, 3S—Mn, 3S—Li, 3S—N, 2S—Ga—Ti, 2S—Ga—V, 2S—Ga—H, 2S—Ga—Mn, 2S—Ga—Li, 2S—Ga—N, 2S—Al—S, 2S—Al—Ga, 2S—Al—Ti, 2S—Al—V, 2S—Al—H, 2S—Al—F, 2S—Al—Mn, 2S—Al—Li, 2S—Al—N, 2S—Ti—V, 3S—V, 2S—H—S, 2S—H—Ga, 2S—H—Ti, 2S—H—V, 2S—H—F, 2S—H—Mn, 2S—H—Li, 2S—H—N, 2S—F—S, 2S—F—Ga, 2S—F—Ti, 2S—F—V, 2S—F—Mn, 2S—F—Li, 2S—F—N, 2S—Mn—S, 2S—Mn—Ti, 2S—Mn—V, 2S—Li—Mn, 2S—Mn—N, 2S—Li—S, 2S—Li—Ti, 2S—Li—V, 2S—Li—N, 2S—N—S, 2S—N—Ti and 2S—N—V.

Examples of the combination of (one deficiency of electrons)×2, one excess of electrons and one excess of electrons are provided below:

2N—V—S, 2N—Ga—S, 2N—Ga—Ti, 2N—Ga—V, 2N—Ga—H, 2N—Ga—Mn, 2N—Ga—Li, 2N—Al—S, 2N—Al—Ga, 2N—Al—Ti, 2N—Al—V, 2N—Al—H, 2N—Al—F, 2N—Al—Mn, 2N—Al—Li, 2N—S—Ti, 2N—Ti—V, 2N—S—V, 2N—H—S, 2N—H—Ga, 2N—H—Ti, 2N—H—V, 2N—H—F, 2N—H—Mn, 2N—H—Li, 2N—H—N, 2N—F—S, 2N—F—Ga, 2N—F—Ti, 2N—F—V, 2N—F—Mn, 2N—F—Li, 2N—F—N, 2N—Mn—S, 2N—Mn—Ti, 2N—Mn—V, 2N—Li—Mn, 2N—Mn—N, 2N—Li—S, 2N—Li—Ti, 2N—Li—V, 3N—S, 3N—Ga, 3N—Al, 3N—Ti, 3N—V, 2N—H, 3N—F, 3N—Mn and 3N—Li.

Examples of the combination of (one deficiency of electrons)×2, one excess of electrons and one excess of electrons are provided below:

2F—S—Ti, 2F—S—V, 3F—S, 2F—Ga—S, 2F—Ga—Ti, 2F—Ga—V, 2F—Ga—H, 3F—Ga, 2F—Ga—Mn, 2F—Ga—Li, 2F—Ga—N, 2F—Al—S, 2F—Al—Ga, 2F—Al—Ti, 2F—Al—V, 2F—Al—H, 2F—Al—Mn, 2F—Al—Li, 2F—Al—N, 2F—Ti—V, 2F—H—S, 2F—H—Ga, 2F—H—Ti, 2F—H—V, 2F—H—F, 2F—H—Mn, 2F—H—Li, 2F—H—N, 3F—Al, 3F—Ti, 3F—V, 3F—H, 3F—Mn, 3F—Li, 2F—Mn—S, 2F—Mn—Ti, 2F—Mn—V, 2F—Li—Mn, 2F—Mn—N, 2F—Li—S, 2F—Li—Ti, 2F—Li—V, F—Li, 2F—Li—N, 2F—N—S, 2F—N—Ti, 2F—N—V and 3F—N.

Examples of the combination of (one deficiency of electrons)×2, one excess of electrons and one excess of electrons are provided below:

2O—S—Ti, 2O—S—V, 2O—Ga—S, 2O—Ga—Ti, 2O—Ga—V, 2O—Ga—H, 2O—Ga—Mn, 2O—Ga—Li, 2O—Ga—N, 2O—Al—S, 2O—Al—Ga, 2O—Al—Ti, 2O—Al—V, 2O—Al—H, 2O—Al—Mn, 2O—Al—Li, 2O—Al—N, 2O—Ti—V, 2O—H—S, 2O—H—Ga, 2O—H—Ti, 2O—H—V, 2O—H—F, 2O—H—Mn, 2O—H—Li, 2O—H—N, 2O—Mn—S, 2O—Mn—Ti, 2O—Mn—V, 2O—Li—Mn, 2O—Mn—N, 2O—Li—S, 2O—Li—Ti, 2O—Li—V, 2O—Li—N, 2O—N—S, 2O—N—Ti and 2O—N—V.

Examples of the combination of two excesses of electrons, one deficiency of electrons and one excess of electrons are provided below:

S—Li—N, 2S—Li, 2S—N, 2S—F, 2N—S, 2Li—Ti, Li—S—Ti, 2S—Ti, Li—N—Ti, N—S—Ti, 2N—Ti, 2L-V, Li—S—V, N—S—V, Li—N—V, 2N—V, 2Li—Mn, Li—Mn—S, 2S—Mn, Mn—N—S, Li—Mn—N, 2N—Mn, 2Li—S, 2Li—N, Li—N—S, 2N—Li, 2Li—F, Li—F—S, Li—F—N, 2L—Mg, Mg—Li—S, Mg—Li—N, Mg-2S, Mg—N—S, Mg—F—S, Mg-2N, Mg—F—N, Mg—F—Li and 2F—Mg.

Examples of the combination of three excesses of electrons, two deficiencies of electrons and one deficiency of electrons are provided below:

V—F—N, Mn—F—Li, Mn—F—S, Mn—F—N, Mn-2F, Al—F—Li, Al—F—S, Al—F—N, Ga—F—S, Ga—F—N and F—S—Ti.

Examples of the combination of four excesses of electrons, two deficiencies of electrons and (one deficiency of electrons)×2 are provided below:

2S—O—Ti and 2Li—O—Ti.

Examples of the combination of four excesses of electrons, two deficiencies of electrons, one deficiency of electrons and one deficiency of electrons are provided below:

F—Mn—Li—S, F—Li—Mn—N, 2F—Mn—Li, Mn—F—N—S, F—Ti—Li—S, F—Li—Ti—N, 2F—Ti—

Li, Ti—F—N—S, F—Ti—Li—O, F—Li—Ti—O, 2F—Ti—N and Ti—F—N—O.

Examples of the combination of two deficiencies of electrons, one excess of electrons and one excess of electrons are provided below:

F—S—Ti, F—S—V, 2F—S, F—Ga—S, 2Ga—F, F—Ga—Ti, F—Ga—V, F—Ga—H, 2F—Ga, F—Ga—Mn, F—Ga—Li, F—Ga—N, F—Al—S, F—Al—Ga, 2Al—F, F—Al—Ti, F—Al—V, F—Al—H, F—Al—F, F—Al—Mn, F—Al—Li, F—Al—N, 2Ti—F, F—Ti—V, 2V—F, F—H—S, F—H—Ga, F—H—Ti, F—H—V, 2H—F, F—H—Mn, F—H—Li, F—H—N, 2F—Al, 2F—Ti, 2F—V, 2F—H, 2F—Mn, 2F—Li, F—Mn—S, F—Mn—Ti, F—Mn—V, 2Mn—F, F—Li—Mn, F—Mn—N, F—Li—S, F—Li—Ti, F—Li—V, F—Li—N, F—N—S, F—N—Ti, F—N—V, 2F—N and 2N—F.

Examples of the combination of three deficiencies of electrons, one excess of electrons, one excess of electrons and one excess of electrons are provided below:

O—S—Ga—Al, O—S—Ga—Ti, O—S—Ga—V, O—S—Ga—Mn, O—S—Ga—H, O—S—Ga—Li, O—S—Ga—N, O—S—Al—Ti, O—S—Al—V, O—S—Al—Mn, O—S—Al—H, O—S—Al—Li, O—S—Al—N, O—S—Ti—V, O—S—Ti—Mn, O—S—Ti—H, O—S—Ti—Li, O—S—Ti—N, O—S—V—Mn, O—S—V—H, O—S—V—Li, O—S—V—N, O—S—Mn—H, O—S—Mn—Li, O—S—Mn—N, O—S—H—Li and O—S—H—N.

Note that in the MgO tunnel barrier layer containing the above-provided additive elements, it is preferable to use a magnetic material containing iron (Fe) or cobalt (Co) for the storage layer 11 and reference layer 12.

Next, the charge compensation pair for grain boundaries will be explained.

The MgO tunnel barrier layer does not have a uniform crystal orientation in the plane of the tunnel barrier layer. One region where the crystal orientation is seamlessly uniform is called a crystal grain, and a spatial void carried a crystal grain boundary, which is also a portion having an electronic state different from that inside the crystal grain is created in the boundary between crystal grains with different orientation directions.

It is known from the first-principles calculations that when there exists a grain boundary, the energy position of the conduction band edge from vacuum, or conduction band minimum, in MgO lowers. As the conduction band edge of MgO lowers, the band gap of MgO becomes narrower. It is considered for this reason that the path of the current through the grain boundary becomes a component of leakage current, which has no spin filtering effect, and thus the TMR ratio is lowered.

Therefore, it is necessary to have not only a charge compensation pair which compensates for the Mg and O vacancies in the crystal grains, but also for that compensates for grain boundaries. The grain boundaries are spaces, so to speak, and the interatomic distance is significantly elongated compared to that of the defect-free MgO lattice. Further, here, it was made clear by the first-principles calculations that an unoccupied bonding orbital created by cation-derived orbital hybridization between the cationic Mg atoms at the interface of the grain boundaries, i.e., the grain boundary walls, and weakly bonded in an elongated distance to each other causes the lowering of the energy position at the conduction band edge of MgO. According this embodiment, such a charge compensation pair was found that can suppress lowering of the conduction band edge, which causes the decrease in the TMR ratio, to compensate for the grain boundaries and modulate the unoccupied bonding orbital created by cation-derived orbital hybridization between the cationic atoms at the grain boundary walls.

One example of the charge compensation pair for grain boundaries is Al and N. As discussed above, by adding both Al and N into the crystal grain, Al substitutes for Mg and N substitutes for O, thus forming a charge compensation pair. When Al and N are added to the crystal grain boundary, O, the anion exposed on the grain boundary wall, binds to Al, the cation added, and Mg, the cation exposed on the grain boundary wall, binds to N, the anion added, thereby achieving stabilization.

Furthermore, the energy gain by Coulomb interaction is maximized when Al and N are adjacent to each other rather than spaced apart. Thus, it has been found that when added in the form of Al—N pair, a spatial stabilization can be achieved as well. Further, it has been also found that with the supplementation of cationic Al atoms, the voids made by crystal grain boundaries are filled and the distance between cationic atoms which are elongated and consequently causes unfavorable orbital hybridization, becomes close to the distance between the cations in the defect-free MgO.

For example, the intercationic distance of Mg—Mg at the crystal grain boundary wall is 0.516 nm, but when a charge compensation pair of Al—N is added, the intercationic distance becomes 0.292 nm because the cationic atoms Al fills the voids. This elongated Mg—Mg distance is reduced dramatically and becomes close to the intercationic Mg distance of the defect-free MgO, 0.298 nm.

As described above, the charge compensation pair Al—N found in this embodiment can suppress the lowering of the conduction band edge, which causes the TMR ratio to decrease, when adding the compensation pair to the crystal grain boundary.

Moreover, as another example of a charge compensation pair for grain boundaries, $AlLiO_2$ will be discussed.

As described above, Al, which compensate for the Mg vacancy in the addition into the crystal gain, involves an excess of one electron and Li involves a deficiency of one electron. It appears that the addition of both Al and Li can complete the charge compensation, but because Mg and O are alternately arranged on the grain boundary wall, an energetically more stabilized structure can be achieved when it is added to the grain boundary so that anion is located adjacent to Mg. Since the charge compensation is already done by trivalent Al and monovalent Li pair, it is optimal to select divalent O as the anion, which does not require to consider charge compensation with O, which is a constituent element of MgO, in consideration of the lattice distortion caused by the addition.

It has been also found that when $AlLiO_2$ is added to the grain boundary, O at the grain boundary wall bonds to the cations added, namely, Al and Li, and Mg at the grain boundary wall bonds to the anion added, O, thus achieving stabilization. Further, it has been also found that the supplementation of the cationic atoms, Al and Li fills the spaces made by the grain boundaries and the distance between the intercationic atoms, elongated and consequently causes unfavorable orbital hybridization, becomes close to the intercationic distance of the defect-free MgO.

For example, the intercation distance of Mg—Mg at the grain boundary wall is 0.516 nm. When a charge compensation pair of $AlLiO_2$ is added, the cationic atoms, Al and Li fill the spaces. Thus, the intercationic distance for Mg—Li is 0.294 nm and that of Mg—Al is 0.345 nm. This elongated Mg—Mg distance is reduced dramatically and becomes close to the intercationic Mg distance of the defect-free MgO, which is 0.298 nm.

As described above, a charge compensation pair of AlLiO$_2$ found in this embodiment can suppress the lowering of the conductance band edge, which causes the TMR ratio to decrease.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure comprising:
    a first magnetic layer having a variable magnetization direction;
    a second magnetic layer having a fixed magnetization direction; and
    a nonmagnetic layer provided between the first magnetic layer and the second magnetic layer, and containing magnesium (Mg) and oxygen (O),
    wherein:
    the nonmagnetic layer further contains a first additive element and a second additive element,
    the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg),
    the second additive element is lithium (Li), and
    the first and second additive elements form a charge compensation pair which is electrically neutral.

2. The device of claim 1, wherein the first and second additive elements compensate at least one of a defect and a grain boundary in the nonmagnetic layer.

3. The device of claim 1, wherein a ratio of the first additive element in the nonmagnetic layer is less than or equal to 5 atomic %, and a ratio of the second additive element in the nonmagnetic layer is less than or equal to 5 atomic %.

4. The device of claim 1, wherein a ratio of the first additive element in the nonmagnetic layer is greater than or equal to 0.002 atomic %, and a ratio of the second additive element in the nonmagnetic layer is greater than or equal to 0.002 atomic %.

5. A magnetic memory device comprising a stacked structure comprising:
    a first magnetic layer having a variable magnetization direction;
    a second magnetic layer having a fixed magnetization direction; and
    a nonmagnetic layer provided between the first magnetic layer and the second magnetic layer, and containing magnesium (Mg) and oxygen (O),
    wherein:
    the nonmagnetic layer further contains a first additive element and a second additive element,
    the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg),
    the second additive element is sulfur (S), and
    the first and second additive elements form a charge compensation pair which is electrically neutral.

6. The device of claim 5, wherein the first and second additive elements compensate at least one of a defect and a grain boundary in the nonmagnetic layer.

7. The device of claim 5, wherein a ratio of the first additive element in the nonmagnetic layer is less than or equal to 5 atomic %, and a ratio of the second additive element in the nonmagnetic layer is less than or equal to 5 atomic %.

8. The device of claim 5, wherein a ratio of the first additive element in the nonmagnetic layer is greater than or equal to 0.002 atomic %, and a ratio of the second additive element in the nonmagnetic layer is greater than or equal to 0.002 atomic %.

9. A magnetic memory device comprising a stacked structure comprising:
    a first magnetic layer having a variable magnetization direction;
    a second magnetic layer having a fixed magnetization direction; and
    a nonmagnetic layer provided between the first magnetic layer and the second magnetic layer, and containing magnesium (Mg) and oxygen (O),
    wherein:
    the nonmagnetic layer further contains a first additive element and a second additive element,
    the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg), and
    the second additive element is nitrogen (N), and
    the first and second additive elements form a charge compensation pair which is electrically neutral.

10. The device of claim 9, wherein the first and second additive elements compensate at least one of a defect and a grain boundary in the nonmagnetic layer.

11. The device of claim 9, wherein a ratio of the first additive element in the nonmagnetic layer is less than or equal to 5 atomic %, and a ratio of the second additive element in the nonmagnetic layer is less than or equal to 5 atomic %.

12. The device of claim 9, wherein a ratio of the first additive element in the nonmagnetic layer is greater than or equal to 0.002 atomic %, and a ratio of the second additive element in the nonmagnetic layer is greater than or equal to 0.002 atomic %.

13. A magnetic memory device comprising a stacked structure comprising:
    a first magnetic layer having a variable magnetization direction;
    a second magnetic layer having a fixed magnetization direction; and
    a nonmagnetic layer provided between the first magnetic layer and the second magnetic layer, and containing magnesium (Mg) and oxygen (O),
    wherein:
    the nonmagnetic layer further contains a first additive element and a second additive element,
    the first additive element is at least one element selected from sulfur (S), gallium (Ga), aluminum (Al), titanium (Ti), vanadium (V), hydrogen (H), fluorine (F), manganese (Mn), lithium (Li), nitrogen (N) and magnesium (Mg), and the second additive element is fluorine (F), and the first and second additive elements form a charge compensation pair which is electrically neutral.

14. The device of claim 13, wherein the first and second additive elements compensate at least one of a defect and a grain boundary in the nonmagnetic layer.

15. The device of claim 13, wherein a ratio of the first additive element in the nonmagnetic layer is less than or equal to 5 atomic %, and a ratio of the second additive element in the nonmagnetic layer is less than or equal to 5 atomic %.

16. The device of claim 13, wherein a ratio of the first additive element in the nonmagnetic layer is greater than or equal to 0.002 atomic %, and a ratio of the second additive element in the nonmagnetic layer is greater than or equal to 0.002 atomic %.

* * * * *